United States Patent
Kim

(10) Patent No.: US 7,963,248 B2
(45) Date of Patent: Jun. 21, 2011

(54) PLASMA GENERATOR, SUBSTRATE TREATING APPARATUS INCLUDING THE SAME AND SUBSTRATE TREATING METHOD

(75) Inventor: Yi Jung Kim, Chungcheongnam-do (KR)

(73) Assignee: Semes Co. Ltd, Chungcheongnam-do (KR)

(*) Notice: Subject to any disclaimer, the term of this patent is extended or adjusted under 35 U.S.C. 154(b) by 994 days.

(21) Appl. No.: 11/888,243

(22) Filed: Jul. 31, 2007

(65) Prior Publication Data

US 2008/0061035 A1 Mar. 13, 2008

(30) Foreign Application Priority Data

Aug. 10, 2006 (KR) .................. 10-2006-0075679

(51) Int. Cl.
 *C23C 16/00* (2006.01)
 *C23F 1/00* (2006.01)
 *H01L 21/306* (2006.01)
(52) U.S. Cl. .............................. 118/723 E; 156/345.43
(58) Field of Classification Search .................. 118/715, 118/722, 723 R, 723 E; 156/345.43, 345.44, 156/345.45, 345.46, 345.47; 315/111.21
See application file for complete search history.

(56) References Cited

U.S. PATENT DOCUMENTS

| | | | |
|---|---|---|---|
| 6,429,595 B1 * | 8/2002 | Hammen et al. | 315/111.21 |
| 2001/0019746 A1 * | 9/2001 | Higashikawa et al. | 427/569 |
| 2002/0007793 A1 * | 1/2002 | Sakai et al. | 118/723 E |
| 2002/0170676 A1 * | 11/2002 | Mitrovic et al. | 156/345.47 |
| 2003/0113479 A1 * | 6/2003 | Fukuda et al. | 427/569 |

FOREIGN PATENT DOCUMENTS

| | | |
|---|---|---|
| JP | 57195737 A * | 12/1982 |
| JP | 2002-158219 | 5/2002 |
| JP | 2003-068651 | 3/2003 |
| JP | 2003-338399 | 11/2003 |
| JP | 2004-111385 | 4/2004 |
| JP | 2004-319285 | 11/2004 |
| KR | 1020010019014 | 3/2001 |
| KR | 1020020078122 | 10/2002 |
| KR | 1020060044089 | 5/2006 |

* cited by examiner

*Primary Examiner* — Maureen Gramaglia

(74) *Attorney, Agent, or Firm* — Jenkins, Wilson, Taylor & Hunt P.A.

(57) ABSTRACT

A plasma generator includes a gas supply member configured to supply source gas and a plurality of electrodes for generating plasma using the source gas. The plurality of electrodes have a long rod shape in a first direction and are arranged abreast in a second direction vertical to the first direction to be spaced apart from each other at the same height. A spaced distance between electrodes is adjusted by means of a distance adjusting unit including a first connector connected to a first electrode, a second connector connected to a second electrode, and a first shaft pin connecting the first and second connectors to each other. The first and second connectors rotate on the first shaft pin to adjust a spaced distance between the first and second electrodes.

21 Claims, 7 Drawing Sheets

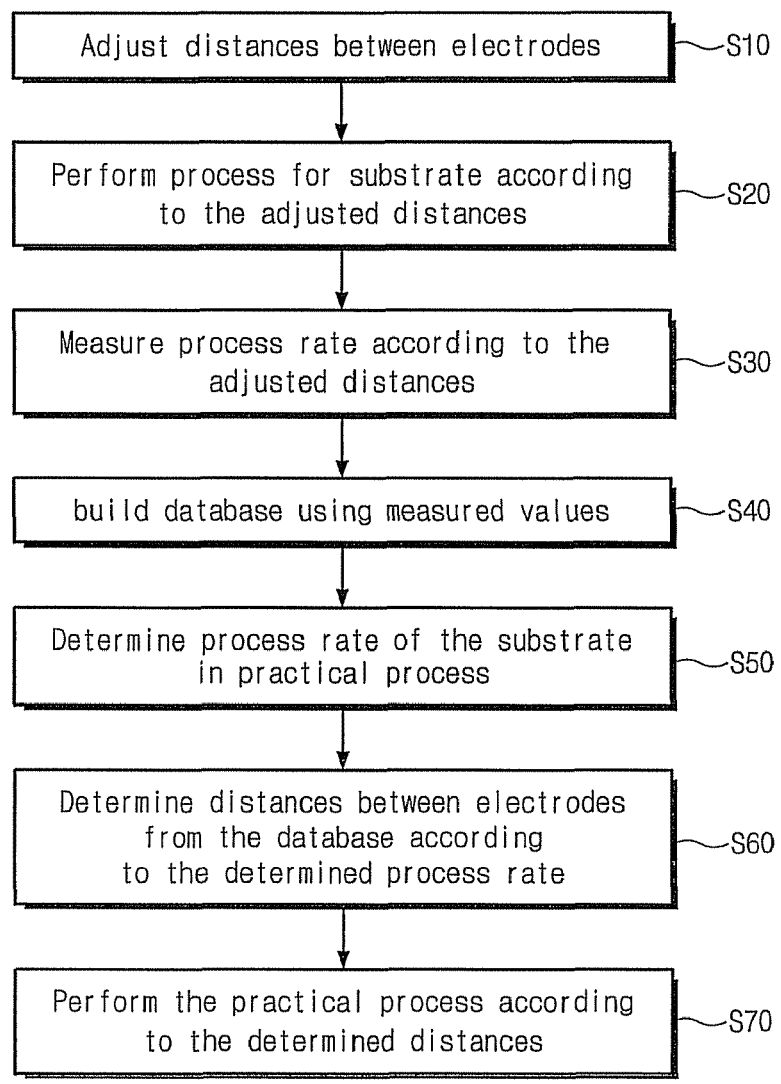

PLASMA GENERATOR, SUBSTRATE TREATING APPARATUS INCLUDING THE SAME AND SUBSTRATE TREATING METHOD

CROSS-REFERENCE TO RELATED APPLICATIONS

This U.S non-provisional patent application claims priority under 35 U.S.C §119 of Korean Patent Application 2006-75679 filed on Aug. 10, 2006, the entirety of which is hereby incorporated by reference.

BACKGROUND

The present invention relates to a plasma generator, a substrate treating apparatus including the same, and a substrate treating method. More specifically, the present invention is directed to a plasma generator capable of adjusting a distance between electrodes, a substrate treating apparatus including the same, and a substrate treating method.

While a variety of methods have been applied to semiconductor manufacturing processes, methods using plasma are widely applied in recent years to energies, novel materials, manufacturing of semiconductor devices, environmental fields and so forth.

Plasma is an ionized state of gas containing ions or electrons and radicals. Generally, plasma treatment means that source gas is converted to plasma and the plasmatic gas is deposited on a substrate or used in cleaning, ashing or etching. After a strong electric field is established between two electrodes, source gas is supplied therebetween to generate the plasma.

In the generation of plasma between two electrodes, significant parameters are a distance therebetween and the amount of source gas supplied therebetween. If a distance between two electrodes is long, a strong electric field cannot be established therebetween. Therefore, source gas is not discharged. If concentration of source gas supplied between two electrodes is low, source gas supplied therebetween is not charged in spite of a strong electric field. Such conditions vary with kind of plasma to be generated.

Accordingly, there are requirements for an apparatus capable of easily adjusting a distance between two electrodes and for changing the position of a source gas supply apparatus when a distance between two electrodes is adjusted.

SUMMARY OF THE INVENTION

Exemplary embodiments of the present invention are directed to a plasma generator. In an exemplary embodiment, the plasma generator may includes: a plurality of electrodes for generating plasma, the electrodes having a long rod shape in a first direction and being arranged abreast in a second direction vertical to the first direction to be spaced apart from each other at the same height; a gas supply member configured to supply source gas to the electrodes; and a distance adjusting unit configured to adjust a spaced distance between the electrodes.

Exemplary embodiments of the present invention are directed to a substrate treating apparatus. In an exemplary embodiment, the substrate treating apparatus may includes: a support member configured to support a substrate such that a patterned surface of the substrate faces upwardly; a plasma generator disposed on the support member and configured to supply internally generated plasma to the substrate, wherein the plasma generator includes: a plurality of electrodes for generating plasma, the electrodes having a long rod shape in a first direction and being arranged abreast in a second direction vertical to the first direction to be spaced apart from each other at the same height; a gas supply member configured to supply source gas to the electrodes; and a distance adjusting unit configured to adjust a spaced distance between the electrodes.

Exemplary embodiments of the present invention are directed to a substrate treating method in which plasma is generated from source gas supplied between a plurality of electrodes arranged abreast to perform a process. In an exemplary embodiment, the substrate treating method may include: connecting a first electrode and a second electrode, among the electrodes, by means of a plurality of connectors; adjusting distances between the electrodes to predetermined distances according to process by means of the connectors; and performing a process using plasma generated by supplying source gas while electric fields are each established between the electrodes.

Exemplary embodiments of the present invention are directed to a substrate treating method in which plasma is generated from source gas supplied between a plurality of electrodes to perform a process. In an exemplary embodiment, the substrate treating method may include: variously adjusting a spaced distance between the electrodes while the electrodes are arranged abreast, performing a process for a substrate according to the adjusted spaced distance, measuring a process rate according to the space, and constructing database using measured values based on the space; determining a spaced distances between the electrodes using the database according to the process rate required in a practical process; and performing the practical process according to the selected space.

BRIEF DESCRIPTION OF THE DRAWINGS

FIG. 8 is a flowchart illustrating a substrate treating method according to the present invention.

DETAILED DESCRIPTION OF PREFERRED EMBODIMENTS

Figure 1:
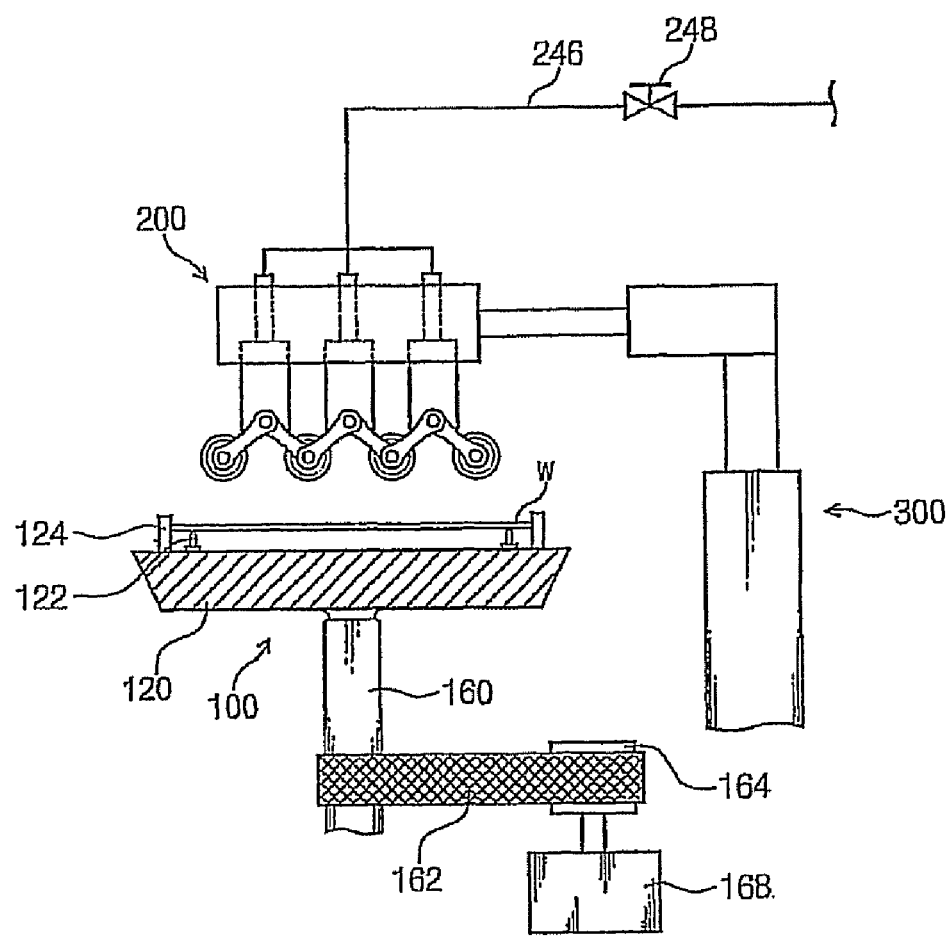
FIG. 1 illustrates a substrate treating apparatus according to the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes of elements are exaggerated for clarity.

While a wafer W will now be described below as one example of a substrate, the present invention is not limited to the description herein. Further a substrate treating apparatus 1, which will now be described below, is provided to generate plasma at an atmospheric pressure and does not require a special vacuum device.

Figure 2:
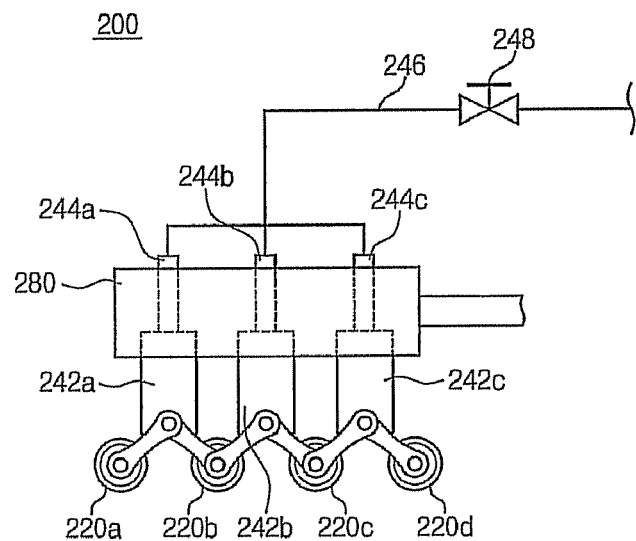
FIG. 2 illustrates a plasma generator according to the present invention.
Figure 3:
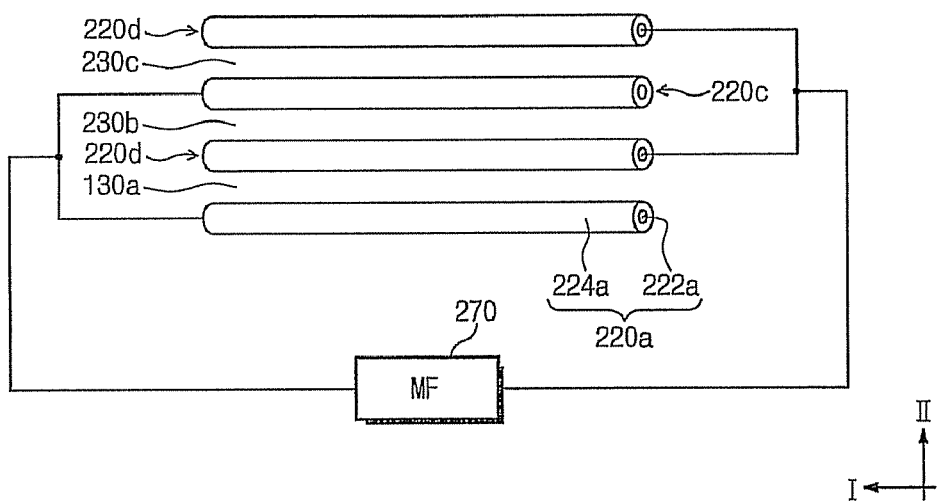
FIG. 3 shows the state where electrodes according to the present invention are each connected to a power.
Figure 4:
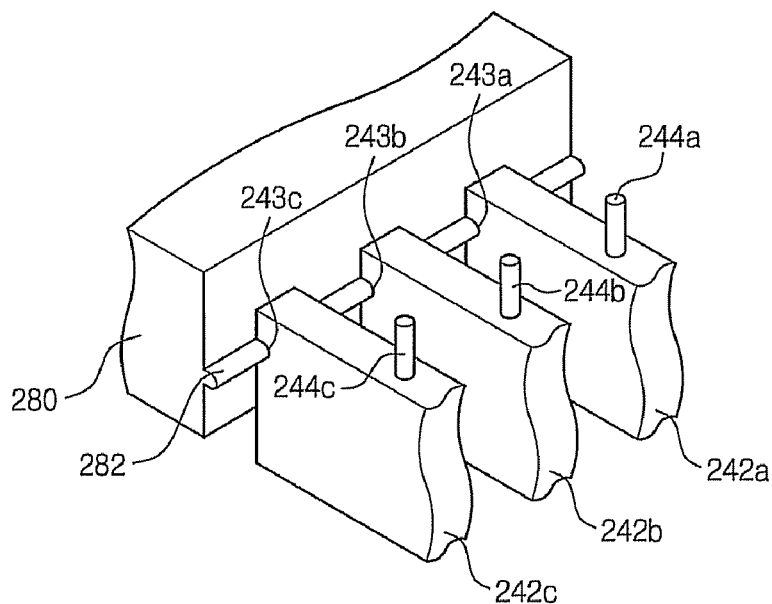
FIG. 4 shows the moving state of a supply member according to the present invention.

FIG. 1 illustrates a substrate treating apparatus 1 according to the present invention, and FIG. 2 illustrates a plasma generator 200 according to the present invention. FIG. 3 shows the state where electrodes 220a, 220b, 220c, and 220d according to the present invention are each connected to a power, and FIG. 4 shows the moving state of a supply member according to the present invention.

The substrate treating apparatus 1 includes a support member 100, a plasma generator 200, and a moving unit 300.

The support member 100 supports a wafer W such that a patterned surface of the wafer W faces upwardly. The support member 100 includes a plate 120 and a support shaft 160 connected to the bottom of the plate 120.

The plate 120 is disk-shaped, and a surface W is loaded on the plate 120 to roughly juxtapose with the plate 120. A plurality of support pins 122 and a plurality of chucking pins 124 are provided to the top surface of the plate 120. The chucking pins 124 are disposed at the edge of the plate 120 to support the side portion of a loaded wafer W. The support pins 122 are disposed inside the chucking pin 124 to support the bottom of the loaded wafer W.

The support shaft 160 is connected to the bottom of the plate 120 to support the plate 120. The support shaft 160 connected to a drive pulley 164 by means of a belt 162, and the drive pulley 164 is connected to a driver 166. Therefore, when the drive pulley 164 rotates through the driver 166, a rotatory force of the drive pulley 164 is transferred to the support shaft 160 through the belt 162.

As illustrated in FIG. 2, the plasma generator 200 is disposed over the support member 100. The plasma generator 200 includes first to fourth electrodes 220a, 220b, 220c, and 220d, first to sixth connectors 260a, 260b, 260c, 260d, 260e, and 260f, and first to third supply members 242a, 242b, and 242c.

The first to fourth electrodes 220a, 220b, 220c, and 220d have a rod shape in a first direction "I". An electrode length is roughly equivalent to or larger than a radius of a wafer W.

The first to fourth electrodes 220a, 220b, 220c, and 220d are disposed to have the same height and arranged in a second direction "II", which is vertical to the first direction "I", to be spaced apart from each other. Accordingly, injection paths are formed at spaces defined by the spaced electrodes, respectively. Plasma is injected through the respective injection paths.

As shown in FIG. 3, a first electrode 220a includes a rod-shaped metal electrode 222a and a dielectric substance 224a disposed to surround the metal electrode 22a. If a power is applied to an electrode after the electrode is made of a dielectric material having a superior dielectric characteristic, plasma having a stable state is generated even under atmospheric pressure. The dielectric substance 224a prevents the meal electrode 222a from being damaged by the arc generated when the plasma is generated. Similarly, each of the second electrode 220b to the fourth electrode 220d includes a rod-shaped metal electrode and a dielectric substance. The dielectric substance 224a is quartz or ceramic.

In this embodiment, a metal electrode has a length that is equivalent to a radius of a wafer W and a longitudinal section of the metal electrode is circular. However, the longitudinal section of the metal electrode may be polygonal such as triangular or quadrangular.

As shown in FIG. 3, a first voltage is applied to first and third electrodes 220a and 220c, and a second voltage lower than the first voltage is applied to second and fourth electrodes 220b and 220d. Thus, electric fields are established between the first and second electrodes 220a and 220b, between the second and third electrodes 220b and 220c, and between the third and fourth electrodes 220c and 220d. As will be described later, source gas is supplied to generate plasma.

The first voltage is applied in parallel to the first and third electrodes 220a and 220c, and the second voltage is applied in parallel to the second ad fourth electrodes 220b and 220d. Thus, although one electrode is short-circuited, normal voltages may be applied to the other electrodes. Further, short-circuited electrodes may be partly replaced. In this embodiment, a medium frequency (MF) power 250 is used. However, a high frequency power may be used.

A gas supply member is installed over the first to fourth electrodes 220a, 220b, 220c, and 220d. The gas supply member includes first to third supply members 242a, 242b, and 242c, first to third supply ports 244a, 244b, and 244c, and a supply line 246.

The first supply member 242a is installed to correspond to the first injection path 230a formed between the first and second electrodes 220a and 220b. The second supply member 242b is installed to correspond to the second injection port 230b formed between the second and third electrodes 220b and 220c. The third supply member 242c is installed to correspond to the third injection path 230c formed between the third and fourth electrodes 220c and 220d.

A first inflow port 244a is formed on the first supply member 242a. Source gas supplied to the first injection path 230a from the first supply member 242a flows into the first supply member 242a through the first inflow port 244a. A second inflow port 244b is formed on the second supply member 242b, and a third inflow port 244c is formed on the third supply member 242c.

As illustrated in FIG. 2, a supply line 246 is connected to first to third inflow ports 244a, 244b, and 244c. Source gas flows into the first to third inflow ports 244a, 244b, and 244c along the supply line 246. The supply line 246 is opened or closed by a valve 248.

The gas supply member further includes a frame 280, which is connected to the tops of the first to third supply members 242a, 242b, and 242c.

As shown in FIG. 4, a guide rail 282 is provided at the inner sidewall of a frame 280 in a second direction "II". A first groove 243a is formed at the top of an outer circumferential surface of a first supply member 242a. The guide rail 282 is inserted into the groove 243a and guides the first supply member 242a to move the first supply member 242a in the second direction "II". A second groove 243b is formed at the top of an outer circumferential surface of the second supply member 242b, and a third groove 243c is formed at the top of an outer circumferential surface of the third supply member 242c. The guide rail 282 is inserted into the second and third grooves 243b and 243c, and second and third supply members 242b and 242c are movable along the guide rail 282 in the second direction "II".

Figure 5:
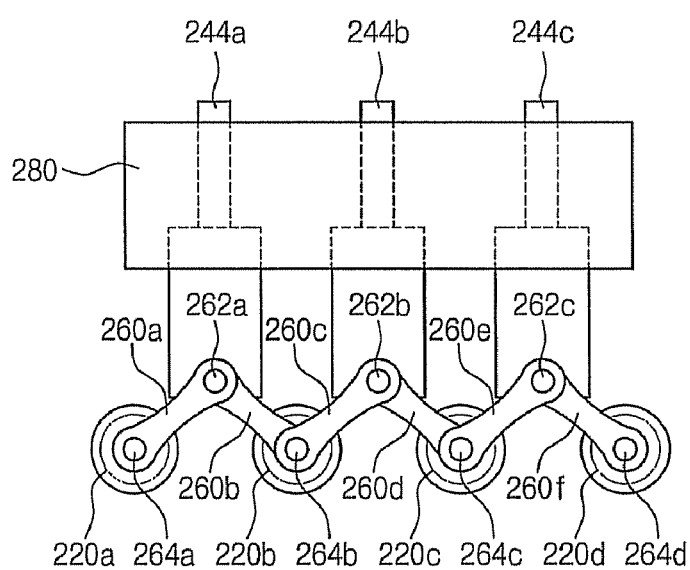
FIG. 5 illustrates a distance adjusting unit according to the present invention.
Figure 6A:
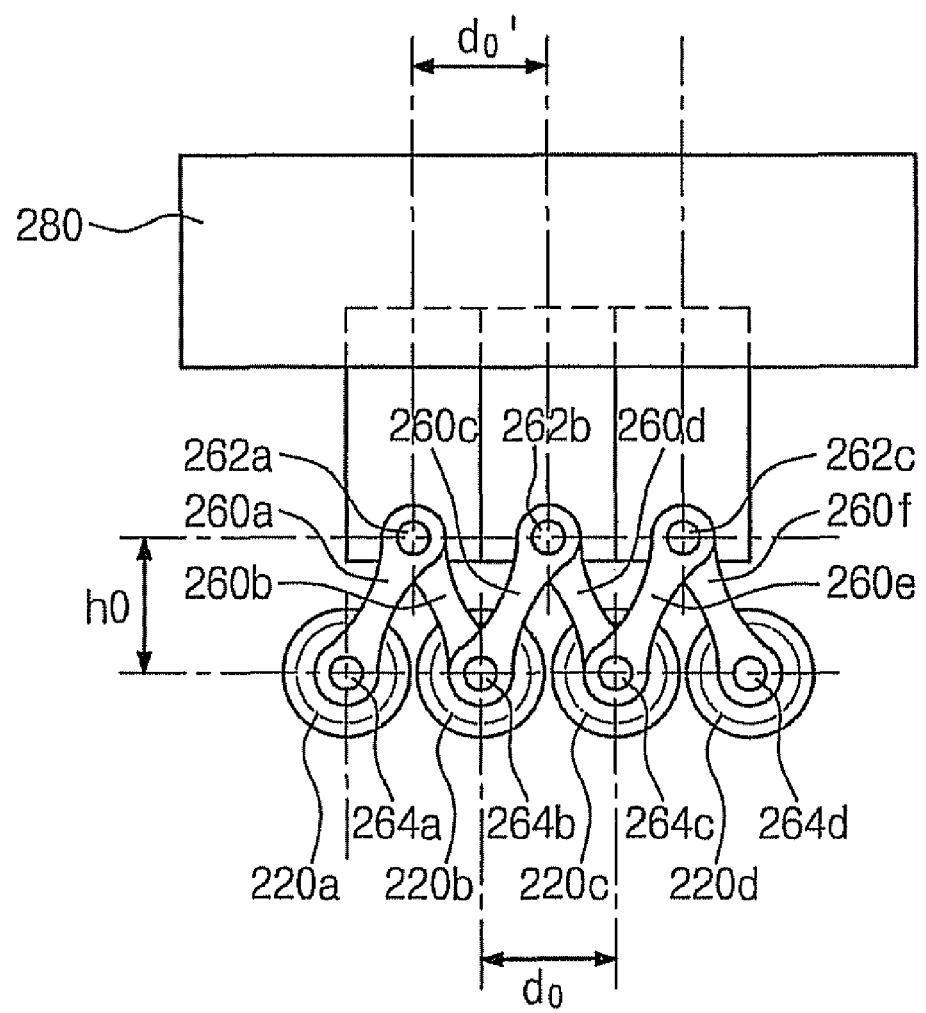
FIGS. 6A and 6B show the operating state of a distance adjusting unit according to the present invention.
Figure 6B:
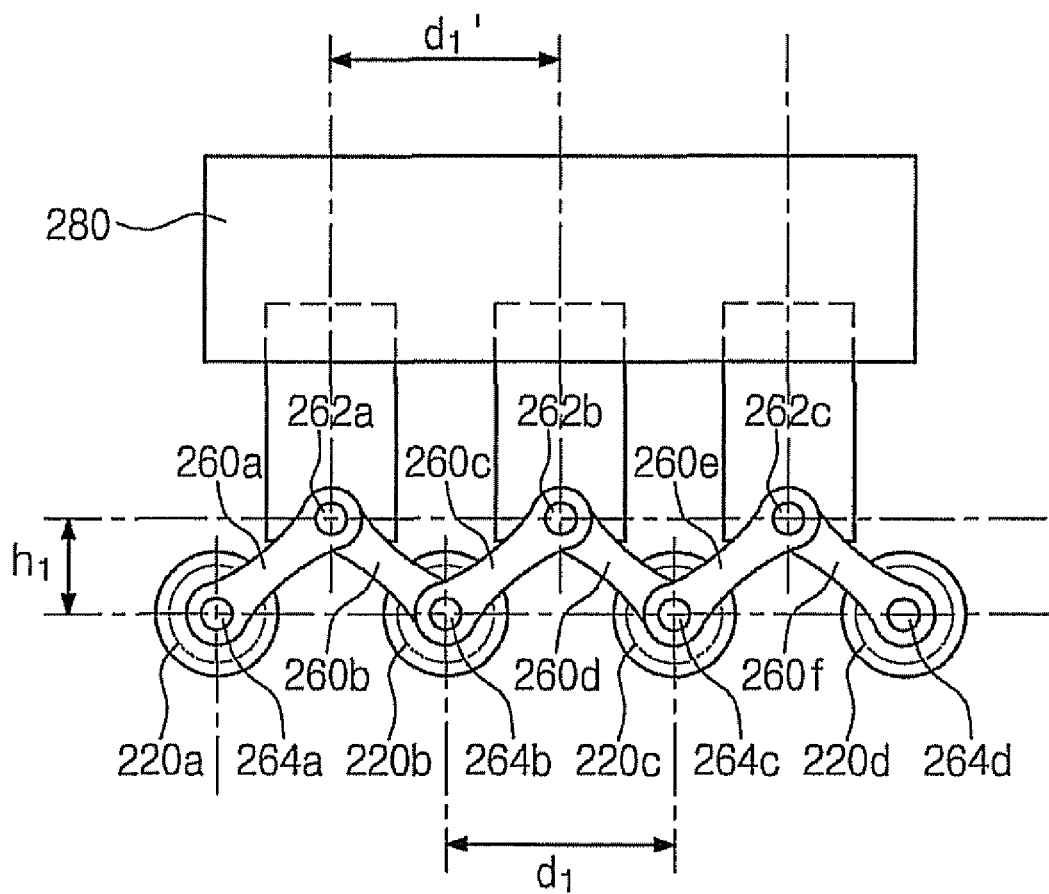

FIG. 5 illustrates a distance adjusting unit according to the present invention. FIGS. 6A and 6B show the operating state of a distance adjusting unit according to the present invention.

The distance adjusting unit includes first to sixth connectors 260a, 260b, 260c, 260d, 260e, and 260f, first to third shaft pins 262a, 262b, and 262c, and first to fourth fixed pin 264a, 264b, 264c, and 264d.

The first shaft pin 262a is connected to the bottom of the first supply member 242a and connects one end of the first connector 260a to one end of the second connector 260b. The other end of the first connector 260a is connected to one end of the first electrode 220a by the first fixed pin 264a, and the other end of the second connector 260b is connected to one end of the second electrode 220b by the second fixed pin 264b. The first and second connectors 260a and 260b are rotatable on the first and second fixed pins 264a and 264b, respectively. Also the first and second connectors 260a and 260b are rotatable on the first shaft pin 262a.

If the first connector 260a rotates counterclockwise on the first shaft pin 262a and the second connector 260b rotates clockwise thereon, the first and second electrodes 220a and 220b come close to each other. If the first electrode 220a rotates clockwise and the second electrode 220b rotates counterclockwise, the first and second electrodes 220a and 220b go away from each other.

The second shaft pin 262b is connected to the bottom of the second supply member 242b and connects one of the third connector 260c to one end of the fourth connector 260d. The other end of the third connector 260c is connected to one end of the second electrode 220b by the second fixed pin 264b, and the other end of the fourth connector 260d is connected to one end of the third electrode 220c. The third and fourth connectors 260c and 260d are rotatable on the second and third fixed pins 264b and 264c, respectively. Also the third and fourth connectors 260c and 260d are rotatable on the second shaft pin 262b.

The third shaft pin 262c is connected to the bottom of the third supply member 242c and connects one end of the fifth connector 260e to one end of the sixth connector 260f. The other end of the fifth connector 260e is connected to one end of the third electrode 220c by the third fixed pin 264c, and the other end of the sixth connector 260f is connected to one end of the fourth electrode 220d by the fourth fixed pin 264d. The fifth and sixth connectors 260e and 260f are rotatable on the third and fourth fixed pins 264c and 264d, respectively. Also the fifth and sixth connectors 260e and 260f are rotatable on the third shaft pin 262c.

A method of adjusting a distance between electrodes will now be described below with reference to FIGS. 6A and 6B.

As illustrated in FIG. 6A, a reference numeral $d_0$ denotes a distance between a second fixed pin 264b and a third fixed pin 264c, and a reference numeral $h_0$ denotes a height between the second fixed pin 264b and a second shaft pin 262b. Further, a reference numeral $d_0'$ denotes a distance between a first shaft pin 262a and the second shaft pin 262b.

First to third supply members 242a, 242b, and 242c move along a guide rail 282 such that a first supply member 242a and a second supply member 242b as well as the second supply member 242b and a third supply member 242c are spaced apart from each other. If the first to third supply members 242a, 242b, and 242c move, a first connector 260a, a third connector 260c, and a fifth connector 260e rotate counterclockwise while a second connector 260b, a fourth connector 260d, and a sixth connector 260f rotate clockwise.

As illustrated in FIG. 6B, if a distance between the first shaft pin 262a and the second shaft pin 262b becomes $d_1'$ larger than $d_0'$, a distance between the second fixed pin 264b and the third fixed pin 264c becomes $d_1$ lager than $d_0$ and a height between the second fixed pin 264b and the second shaft pin 262b becomes $h_1$ smaller than $h_0$. That is, if a distance between the first and second supply members 242a and 242b and a distance between the second and third supply members 242b and 242c increase, a distance between first and second electrodes 220a and 220b, a distance between second and third electrodes 220b and 220b, and a distance between third and fourth electrodes 220c and 220d increase.

However, a distance between the first fixed pin 264a and the first shaft pin 262a decreases and a distance between the bottom of the first supply member 242a and the first electrode 220a and a distance between the bottom of the first supply member and the second electrode 220b decrease.

The height $h_1$ between the second fixed pin 264b and the second shaft pin 262b is determined according to the distance $d_1$ between the second and third electrodes 220b and 220c and a length of the third connector 260c. Therefore, if the length of the third connector 260c is suitably adjusted, not only a distance between electrodes but also a distance between an electrode and a supply member may be adjusted according to user's need.

In this embodiment, since the first and second connectors 260a and 260b have the same length, the first supply member 242a is disposed between the first and second electrodes 220a and 220b even if the distance therebetween is varied.

Figure 7:
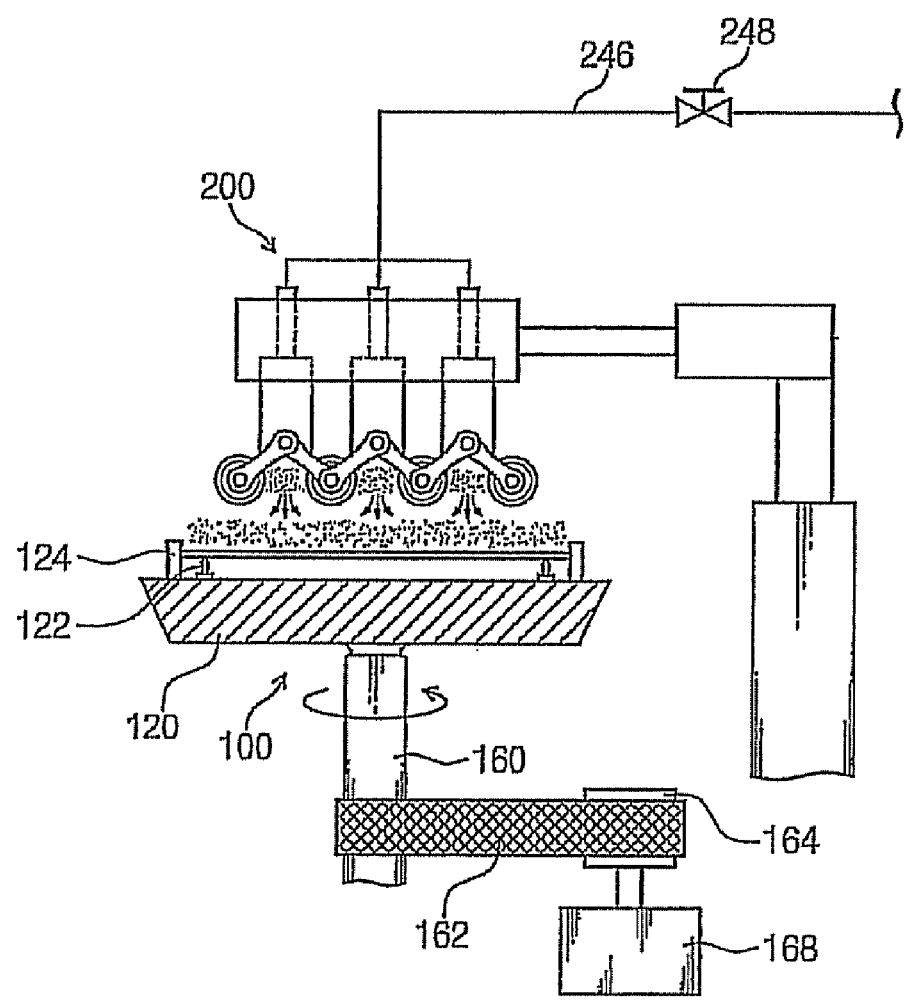
FIG. 7 shows the state where a substrate is treated by means of a substrate treating apparatus according to the present invention.

FIG. 7 shows the state where a wafer W is treated by means of a substrate treating apparatus 1 according to the present invention.

A wafer W is loaded on a plate 120. The loaded wafer W is supported by a support pin 122 and a chucking pin 124. The plate 120 is supported by a support shaft 160, which is rotated by means of a driver 166.

Using a drive unit 300, a plasma generator 200 is placed over the wafer W. At this point, a user must adjust a distance between electrodes inside the plasma generator by means of a distance adjusting unit. The distance between electrodes may be determined according to the plasma type to be generated or the process type. The method of adjusting a distance between electrodes is the same as described above.

A first voltage is applied to first and third electrodes 220a and 220c, and a second voltage lower than the first voltage is applied to second and fourth electrodes 220b and 220d. If the first and second voltages are applied, potential differences are made between the first and second electrodes 220a and 220b and between the third and fourth electrodes 220c and 220d, respectively. Thus, electric fields are established.

Source gas is supplied to first to third injection paths 230a, 230b, and 230c. After source gas is supplied to first to third supply ports 244a, 244b, and 244c along a supply line, it is supplied to the first to third injection paths 230a, 230b, and 230c through first to third supply members 242a, 242b, and 242c.

As described above, the first supply member 242a is disposed between the first and second electrodes 220a and 220b, the second supply member 242b is disposed between the second and third electrodes 220b and 220c, and the third supply member 242c is disposed between the third and fourth electrodes 220c and 220. Therefore, the source gas may be uniformly supplied into the first to third injection paths 230a, 230b, and 230c.

If the source is supplied, plasma is generated between the first and second electrodes 220a and 220b, between the second and third electrodes 220b and 220c, and between the third and fourth electrodes 220c and 220d. The generated plasma flows to the top surface of a wafer W along the flow of continuously supplied source gas, being used to treat the top surface of the wafer W.

According to the foregoing, a distance between electrodes is readily adjusted and a distance between an electrode and a supply member is also adjusted. Moreover, since a position of a supply member configured to supply source gas between electrodes changes with the variation of a distance between the electrodes, the source gas is uniformly supplied to a space defined between the electrodes.

FIG. 8 is a flowchart illustrating a substrate treating method according to the present invention. As described above, a distance between two electrodes is a significant parameter in plasma treatment for a wafer W. An optimized distance is variable with the kind of supplied source gases and process steps for a substrate. Thus, a plasma generator 200 may be used below to adjust an optimized distance according to the source gas or process steps.

Spaces between first to fourth electrodes 220a, 220b, 220c, and 220d are variously adjusted (S10). A method of setting the spaces between the first to fourth electrodes 220a, 220b, 220c, and 220d are the same as described above.

A process for a wafer W is performed according to the adjusted spaced distances (S20). When the process is performed, the same source gas is supplied and the spaced distances are variously set. After the lapse of predetermined time, a process rate according to the adjusted spaced distances is measured (S30). Database is built using the measured values (S40).

A wafer process rate required in a practical process is predetermined (S50). According to the predetermined process rate, an optimized spaced distances between electrodes are determined from the database (S60). The practical process is performed according to the determined spaced distance (S70).

According to the foregoing, a process rate is measured while readily adjusting a distance between electrodes. Further, an optimized value is selected according to the process rate predetermined during a practical process.

As explained so far, a distance between electrodes is readily adjusted and a distance between an electrode and a supply member is also adjusted. Moreover, a position of a supply member configured to supply source gas between electrodes changes with the variation of a distance between the electrodes.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A plasma generator comprising:
a first electrode disposed adjacent a second electrode for generating plasma, the first and second electrodes having a long rod shape in a first direction and being arranged abreast in a second direction vertical to the first direction and spaced apart from each other a first distance, and wherein a first voltage is applied to the first electrode and a second voltage is applied to the second electrode, the second voltage being lower than the first voltage;
a gas supply member configured to supply source gas to the electrodes; and
a distance adjusting unit configured to adjust a spaced distance between the electrodes, the distance adjusting unit comprising a first shaft pin and first and second connectors, the first connector having one end rotatably connected to the first shaft pin and the other end rotatably connected to the first electrode, the second connector having one end rotatably connected to the first shaft pin and the other end rotatably connected to the second electrode, and wherein the first distance between the first and second electrodes is adjusted by the first and second connectors rotating on the first shaft pin.

2. The plasma generator of claim 1, wherein the gas supply member comprises:
a first supply member provided at top surfaces of the first and second electrodes to supply source gas between the first and second electrodes along a path formed in the first supply member,
wherein the first shaft pin is fixedly installed at the first supply member.

3. The plasma generator of claim 1, further comprising:
a third electrode to which the first voltage is applied, the second electrode disposed between the first and third electrodes.

4. The plasma generator of claim 3, wherein the distance adjusting unit further comprises:
a second shaft pin;
a third connector having one end rotatably connected to the second shaft pin and the other end rotatably connected to the second electrode; and
a fourth connector having one end rotatably connected to the second shaft pin and the other end rotatably connected to the third electrode,
wherein the first and second connectors rotate on the first shaft pin to adjust a spaced distance between the first and second electrodes, and the third and fourth connectors rotate on the second shaft pin to adjust a spaced distance between the second and third electrodes.

5. The plasma generator of claim 4, wherein the gas supply member comprises:
a first supply member provided at top surfaces of the first and second electrodes to supply source gas between the first and second electrodes along a path formed in the first supply member; and
a second supply member provided at top surfaces of the second and third electrodes to supply source gas between the second and third electrodes along a path formed in the second supply member,
wherein the first shaft pin is fixedly installed at the first supply member, and the second shaft pin is fixedly installed at the second supply member.

6. The plasma generator of claim 5, wherein the plasma generator further comprising:
a frame connected to the tops of the first and second supply members for guiding the first and second supply members to move in the second direction,
wherein the second and third connectors rotate with the movement of the first and second supply members.

7. The plasma generator of claim 6, wherein a guide rail is provided at the frame, the guide rail being formed in the second direction; and
grooves are formed at outer circumferential surfaces of the first and second supply members.

8. A substrate treating apparatus comprising:
a support member configured to support a substrate such that a patterned surface of the substrate faces upwardly;
a plasma generator configured to supply plasma to the substrate,
wherein the plasma generator comprises:
a first electrode to which a first voltage is applied;
a third electrode to which the first voltage is applied; and
a second electrode to which a second voltage is applied, the second electrode being disposed between the first and third electrodes and the second voltage being lower than the first voltage, and the first, second, and third electrodes having a long rod shape in a first direction and being arranged abreast in a second direction vertical to the first direction and spaced apart from each other at the same spaced distance;
a gas supply member configured to supply source gas to the electrodes; and a distance adjusting unit configured to adjust a spaced distance between the electrodes, the distance adjusting unit comprising:
a first shaft pin;
a first connector having one end rotatably connected to the first shaft pin and the other end rotatably connected to the first electrode;
a second connector having one end rotatably connected to the first shaft pin and the other end rotatably connected to the second electrode;
a second shaft pin;
a third connector having one end rotatably connected to the second shaft pin and the other end rotatably connected to the second electrode; and
a fourth connector having one end rotatably connected to the second shaft pin and the other end rotatably connected to the third electrode,
wherein the first and second connectors rotate on the first shaft pin to adjust a spaced distance between the first and second electrodes, and the third and fourth connectors rotate on the second shaft pin to adjust a spaced distance between the second and third electrodes.

9. The substrate treating apparatus of claim 8, wherein the gas supply member comprises:
a first supply member provided at top surfaces of the first and second electrodes to supply source gas between the first and second electrodes along a path formed in the first supply member; and
a second supply member provided at top surfaces of the second and third electrodes to supply source gas between the second and third electrodes along a path formed in the second supply member,
wherein the first shaft pin is fixedly installed at the first supply member, and the second shaft pin is fixedly installed at the second supply member.

10. The substrate treating apparatus of claim 9, wherein the plasma generator further comprising:
a frame connected to the tops of the first and second supply members for guiding the first and second supply members to move in the second direction,
wherein the second and third connectors rotate with the movement of the first and second supply members.

11. The substrate treating apparatus of claim 10, wherein a guide rail is provided at the frame, the guide rail being formed in the second direction; and
grooves are formed at outer circumferential surfaces of the first and second supply members.

12. A plasma generator comprising:
a plurality of electrodes for generating plasma, the plurality of electrodes comprising a long rod shape in a first direction and being arranged abreast in a second direction vertical to the first direction and spaced apart from each other uniformly at a spaced distance;
a gas supply member for supplying a source gas to the plurality of electrodes; and
a distance adjusting unit disposed below the gas supply member for adjusting the spaced distance between the plurality of electrodes, the plurality of electrodes being rotatable with respect to at least a portion of the distance adjusting unit, the distance adjusting unit comprising at least one shaft pin rotatably connected to a first electrode of the plurality of electrodes for rotating the first electrode about the at least one shaft pin from a first position to a second position, when in the first position the first electrode is spaced apart from a second electrode at a first spaced distance and when in the second position the first electrode is spaced apart from the second electrode at a second spaced distance;

wherein the at least one shaft in is rotatably connected to the first and second electrodes by first and second connectors, each of the first and second connectors having a proximal end rotatably connected to a first shaft in and the first connector rotatably connected to the first electrode at a first distal end and the second connector rotatably connected to the second electrode at a second distal end, and wherein the spaced distance between the first and second electrodes is adjusted by the first and second connectors rotating on the first shaft pin.

13. The plasma generator of claim 12, wherein a first voltage is applied to the first electrode and a second voltage is applied to the second electrode, the second voltage being lower than the first voltage.

14. The plasma generator of claim 13, wherein the plurality of electrodes comprises third and fourth electrodes, the second electrode being disposed between the first and third electrodes, wherein the first voltage is applied to each of the first and third electrodes and the second voltage is applied to each of the second and fourth electrodes.

15. The plasma generator of claim 14, further comprising:
a second shaft pin;
a third connector having one end rotatably connected to the second shaft pin and the other end rotatably connected to the second electrode; and
a fourth connector having one end rotatably connected to the second shaft pin and the other end rotatably connected to the third electrode;
wherein the third and fourth connectors rotate on the second shaft pin to adjust a spaced distance between the second and third electrodes.

16. The plasma generator of claim 15, wherein the gas supply member comprises:
a first supply member provided at top surfaces of the first and second electrodes to supply source gas between the first and second electrodes along a first path formed in the first supply member; and
a second supply member provided at top surfaces of the second and third electrodes to supply source gas between the second and third electrodes along a second path formed in the second supply member,
wherein the first shaft pin is fixedly installed at the first supply member, and the second shaft pin is fixedly installed at the second supply member.

17. The plasma generator of claim 16, wherein the plasma generator further comprises:
a frame connected to the tops of the first and second supply members for guiding the first and second supply members to move in the second direction,
wherein the second and third connectors rotate with the movement of the first and second supply members.

18. The plasma generator of claim 17, wherein a guide rail is provided at the frame, the guide rail being formed in the second direction; and
grooves are formed at outer circumferential surfaces of the first and second supply members.

19. The plasma generator of claim 12, wherein the plurality of electrodes are located at a first height from the gas supply member when in the first position and a second height from the gas supply member when in the second position, the first and second heights being adjusted by adjusting the spaced distance between the plurality of electrodes.

20. The plasma generator of claim 19, wherein the first spaced distance is greater than the second spaced distance, and the first height is less than the second height.

21. The plasma generator of claim 19, wherein the first spaced distance is less than the second spaced distance, and the first height is greater than the second height.

* * * * *